(12) United States Patent
DiVergilio et al.

(10) Patent No.: US 6,949,895 B2
(45) Date of Patent: Sep. 27, 2005

(54) UNIPOLAR ELECTROSTATIC QUADRUPOLE LENS AND SWITCHING METHODS FOR CHARGED BEAM TRANSPORT

(75) Inventors: William F. DiVergilio, Beverly, MA (US); Youngzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 134 days.

(21) Appl. No.: 10/654,168

(22) Filed: Sep. 3, 2003

(65) Prior Publication Data

US 2005/0045835 A1 Mar. 3, 2005

(51) Int. Cl.[7] .................................................. H06H 9/00
(52) U.S. Cl. ......................................... 315/505; 315/506
(58) Field of Search ................................. 315/506, 505, 315/507, 501, 500; 250/423–427, 492.2

(56) References Cited

U.S. PATENT DOCUMENTS

| | | | | |
|---|---|---|---|---|
| 2,919,381 A | * | 12/1959 | Glaser | 315/382 |
| 3,147,445 A | * | 9/1964 | Wuerker et al. | 250/292 |
| 4,560,905 A | * | 12/1985 | Maschke | 315/5.41 |
| 4,667,111 A | * | 5/1987 | Glavish et al. | 250/492.2 |
| 4,736,107 A | | 4/1988 | Myron | 250/492.2 |
| 4,761,559 A | | 8/1988 | Myron | 250/492.2 |
| 4,912,421 A | * | 3/1990 | Anderson | 315/500 |
| 4,914,305 A | | 4/1990 | Benveniste et al. | 250/492.3 |
| 5,430,359 A | * | 7/1995 | Swenson et al. | 315/501 |
| 5,554,854 A | | 9/1996 | Blake | 250/492.2 |

* cited by examiner

Primary Examiner—Don Wong
Assistant Examiner—Ephrem Alemu
(74) Attorney, Agent, or Firm—Eschweiler & Associates, LLC

(57) ABSTRACT

A linear acceleration system comprises one or more accelerating stages along an axis and a unipolar electrostatic quadruple lens in series with the one or more accelerating stages. The unipolar electrostatic quadruple lens focuses an ion beam in a direction transverse to the axis. The unipolar electrostatic quadruple lens includes a switching circuit, a first pair of electrodes, and a second pair of electrodes. The switching circuit controllably connects to ground and a first voltage potential. The electrodes of the first pair are located opposite each other and are connected to the switching circuit. The electrodes of the second pair are also located opposite each other and connected to the switching circuit. The second pair of electrodes are biased to a second voltage potential.

16 Claims, 8 Drawing Sheets

UNIPOLAR ELECTROSTATIC QUADRUPOLE LENS AND SWITCHING METHODS FOR CHARGED BEAM TRANSPORT

FIELD OF INVENTION

The present invention relates generally to ion implantation devices, and, more particularly, to a unipolar electrostatic quadruple lens and use of the lens usable within an ion implantation system.

BACKGROUND OF THE INVENTION

Ion implantation is a process that is employed in semiconductor device fabrication to selectively implant dopant into semiconductor and/or wafer material. For ion implantation, dopant atoms/molecules are ionized and isolated, accelerated, formed into a beam, and swept across a wafer. The dopant ions physically bombard the wafer, enter the surface and come to rest below the surface.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to the desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system, referred to as a linear accelerator, is employed in some systems to accelerate the desired dopant ions to a predetermined energy to penetrate the wafer surface. For acceleration, the system is generally of a linear design with annular powered electrodes and quadruple lenses positioned and extending along its axis. The quadruple lenses are powered by negative and positive electrical potentials. As the dopant ions enter therein, they are accelerated therethrough by the powered electrodes and are (as a beam) selectively focused by the quadruple lenses.

Continuing on, the dopant ions are directed towards wafer(s) at an end station. The wafers can be located on a process disk that rotates at a selected rotational speed. The dopant ions, as a beam, impact the wafer with a specific beam current.

Generally, there is a substantial loss of beam current as the dopant ions pass through the acceleration system. This loss is particularly high at lower energies. Such loss of beam current can increase the cost, complexity, and difficulty of performing ion implantations. Furthermore, such loss of beam current can limit an operational range of the acceleration system and, thereby, the ion implantation system of which the acceleration system is a part. Accordingly, it is desirable to mitigate loss of beam current through acceleration systems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention mitigates loss of beam current, particularly for low energy ion implants. The present invention utilizes electrostatic quadruple lenses, each energized by a unipolar power supply rather than a bipolar supply, to transport a low energy ion beam through the linear accelerator section of an ion implanter. In particular, this method is used when the acceleration is set to zero. As a result, the ion implantation system is able to operate at lower energies, thereby extending its operation range In addition, the present invention also includes systems and methods for switching between bipolar wiring and unipolar wiring.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
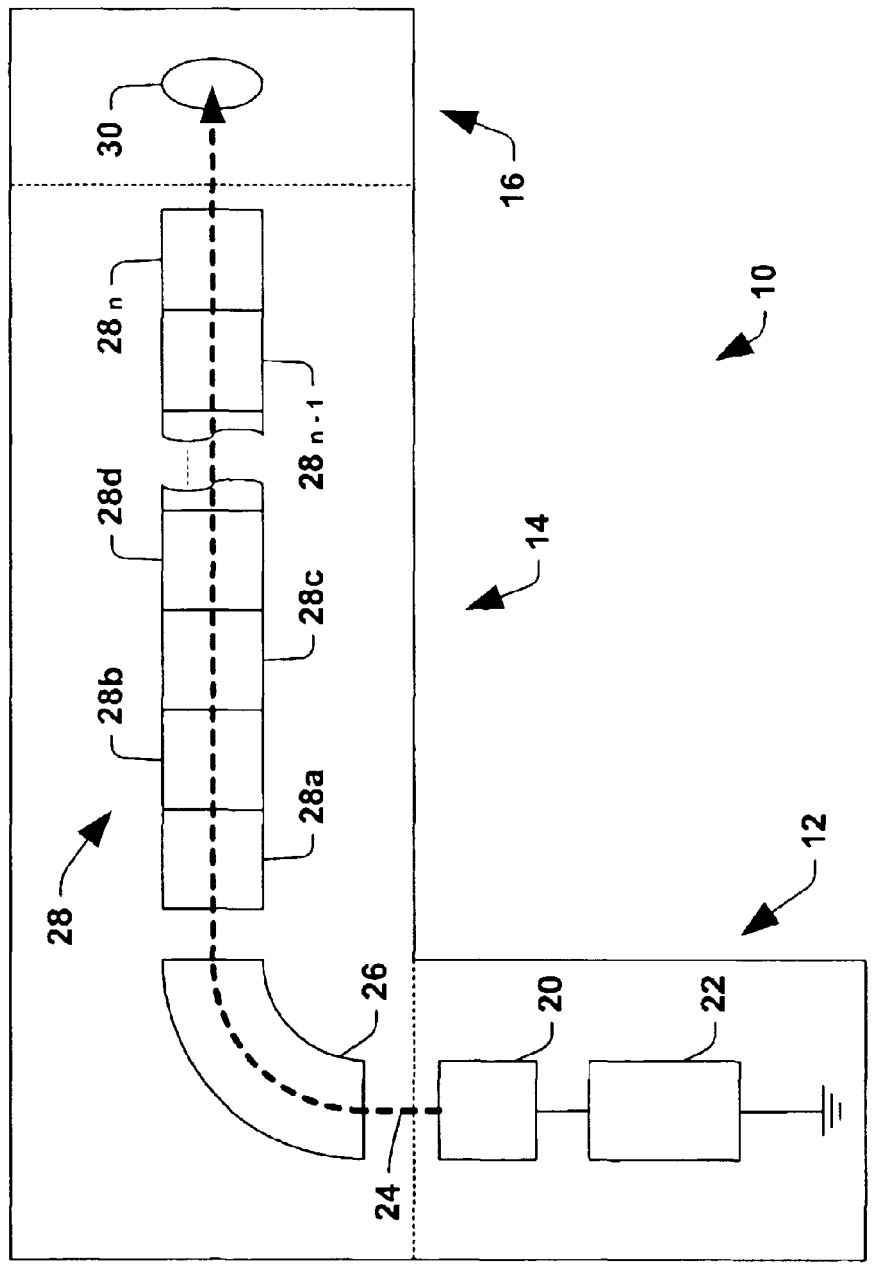
FIG. 1 is a diagram illustrating a high energy ion implantation system in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates ion implantation by reducing degradation of beam current through the linear accelerator section of a high energy implanter. A series of unipolar quadruple lenses are employed instead of bipolar quadruple lenses. The use of the unipolar quadruple lenses mitigates beam current loss and can extend an operation range of the ion implantation system.

Beginning with FIG. 1, a diagram of an exemplary high energy ion implantation system 10 in accordance with an aspect of the present invention is illustrated. The system 10 has a terminal 12, a beamline assembly 14, and an end station 16. The terminal 12 includes an ion source 20 powered by a high voltage power supply 22. The ion source 20 produces an ion beam 24 that is provided to the beamline assembly 14. The ion beam 24 is then directed toward a target wafer 30 in the end station 16. The ion beam 24 is conditioned by the beamline assembly 14 that comprises a mass analysis magnet 26 and a radio frequency (RF) linear accelerator (linac) 28. The linac 28 includes a series of accelerating modules 28a–28n, each of which may further accelerate ions beyond the energies they achieve from prior modules. The accelerating modules may be individually energized by a high RF voltage that is typically generated by a resonance method to keep the required average power reasonable. The mass analysis magnet 26 passes only ions of an appropriate charge-to-mass ratio to the linac 28.

The linear accelerating modules 28a–28n in the system 10 of the present example individually include an RF amplifier, a resonator, an energizable electrode, and a unipolar electrostatic quadruple lens, also referred to as a quadruple lens. The resonators operate at a suitable frequency (e.g., in the range of about 3–30 Mhz, with a voltage of about 0 to 150 kV) to accelerate ions of the beam 24 to desired energies (e.g., over one million electron volts per charge state). As the ion beam 24 travels through the various accelerating modules or stages 28, the ions are accelerated and tend to spread apart.

The unipolar electrostatic quadruple lenses individually comprise four equally spaced electrodes around a central axis and generate quadrupole fields transverse to the path of the ion beam 24. A first pair of the electrodes, positioned opposite each other, is at a negative potential and a second pair of the electrodes is at a ground potential. As a result of the generated electrostatic fields, the unipolar electrostatic quadrupole lenses have focusing effects on the ion beam 24. The first of the pair of lenses, in one example, focuses in a vertical plane and defocuses in a horizontal plane whereas the second of the pair of lenses focuses in a horizontal plane and defocuses in a vertical plane. By adjusting the negative potential applied to the unipolar electrostatic quadrupole lenses throughout the linear accelerating modules 28a–28n, de-spreading of the ion beam 24 can be reduced and the ion beam 24 can be focused to a desired shape.

The use of unipolar electrostatic quadrupole lenses mitigates degradation of the neutralization of the ion beam 24 because of the absence of a positive potential, which is typically employed in conventional electrostatic quadrupole lenses. As a result, the beam current of the ion beam 24 is greater than that of conventional ion implantation systems that employ conventional positive and negative bipolar electrostatic quadrupole lenses.

Figure 2:
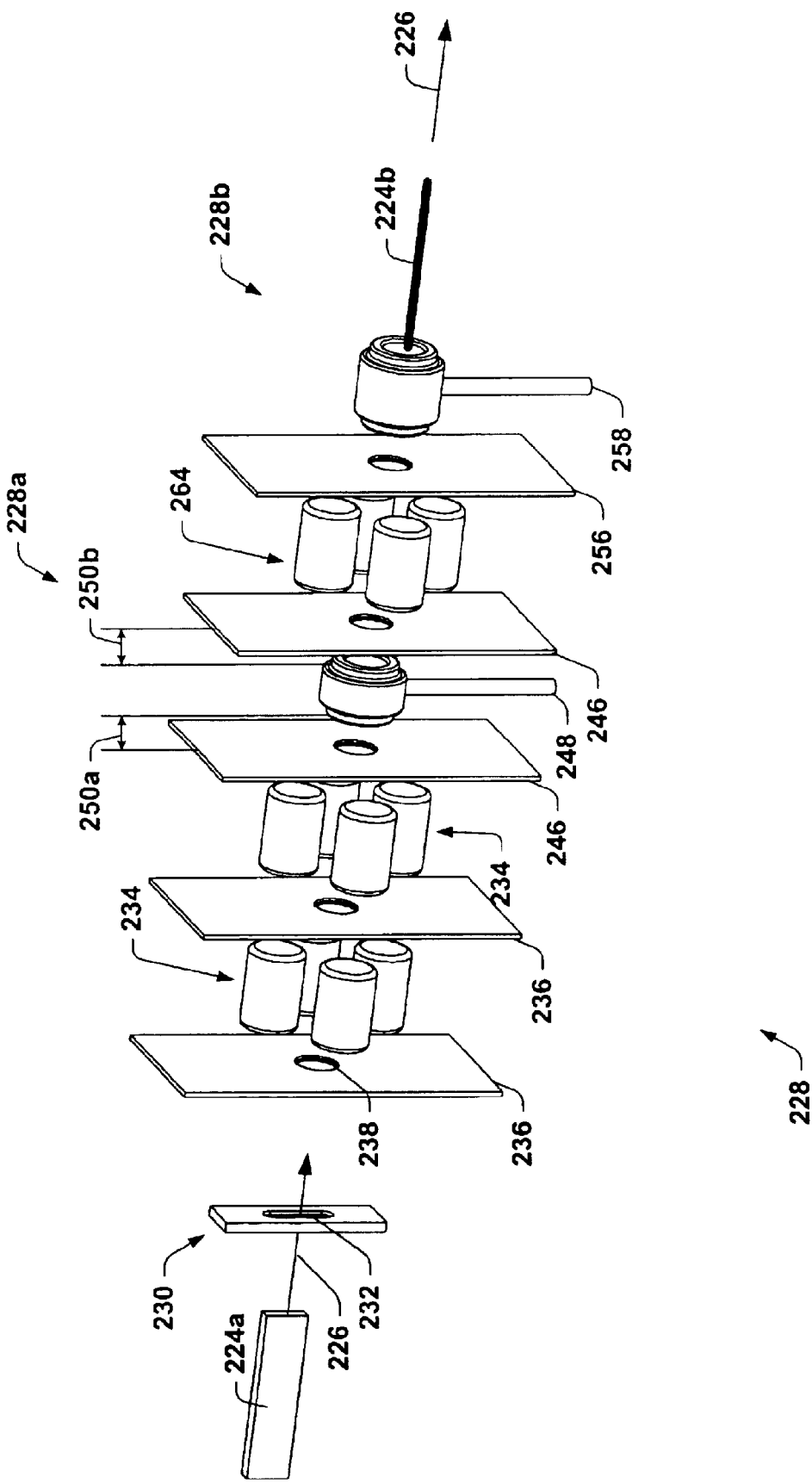
FIG. 2 is a perspective view of a modular linear accelerator in accordance with an aspect of the present invention.

A perspective view of an exemplary modular linear accelerator module or stage 228 in accordance with an aspect of the present invention is provided in FIG. 2. A DC ion beam 224a is provided to the accelerator 228 (e.g., from an upstream mass analyzer magnet, not shown), along a beam path 226. The DC beam 224a may comprise, for example, an elongated slit profile that is passed through an entrance aperture 230 having a vertically elongated slit 232 along the path 226. The beam 224a is formed into a generally circular profile (not shown) via two sets of matching quadrupole devices 234 and corresponding grounded electrodes 236, wherein the grounded electrodes 236 each comprise a cylindrical aperture 238 located along the path 226. The quadrupole devices 234 of the present invention comprise a pair of unipolar electrostatic quadrupole lenses, wherein a first of the pair focuses in a vertical plane and a second of the pair focuses in a horizontal plane.

The linear accelerator 228 further comprises two or more accelerating modules or stages 228a, 228b, . . . 228n, where n is an integer, two of which (e.g., stages 228a and 228b) are illustrated in FIG. 2. Each of the accelerator modules 228n may further accelerate ions from the beam 224 beyond the energies they achieve from prior modules. The accelerating modules 228n may be individually energized by high RF voltages generated by a power supply and resonator (not shown). The accelerating module 228a comprises a pair of grounded electrodes 246 located before and after an energizable electrode 248 along the path 226, where the energizable electrode 248 may be energized by an appropriate RF energy source and resonator (not shown) in order to achieve acceleration of ions within the beam 224a along the beam path 226. The grounded electrodes 246 are generally equally spaced from the energizable electrode 248 to provide first and second generally equal gaps 250a and 250b therebetween. Similarly, the second accelerator module or stage 228b comprises a first grounded electrode 256 located along the path 226 upstream of a second energizable electrode 258.

A quadrupole device 264, also a unipolar electrostatic quadrupole lens, may be provided along the path 226 between the first and second accelerator stages 228a and 228b to provide for radial focusing of the beam 224 as it travels through successive accelerator stages 228. The accelerator 228 may comprise further accelerating stages or modules (not shown), whereby an ion beam 224b may be accelerated to an energy level higher than that of the DC beam 224a provided to the accelerator 228. Although only one quadrupole lens 264 is illustrated for the stage 228a in FIG. 2, it should be understood that a pair of such lenses may be provided similar to the lenses 234. Further, while in one example, each stage 228a–228n of the linear accelerator employs the unipolar quadrupole lenses, the present invention also contemplates variations in which such lenses are employed in less than all the stages.

Figure 3:
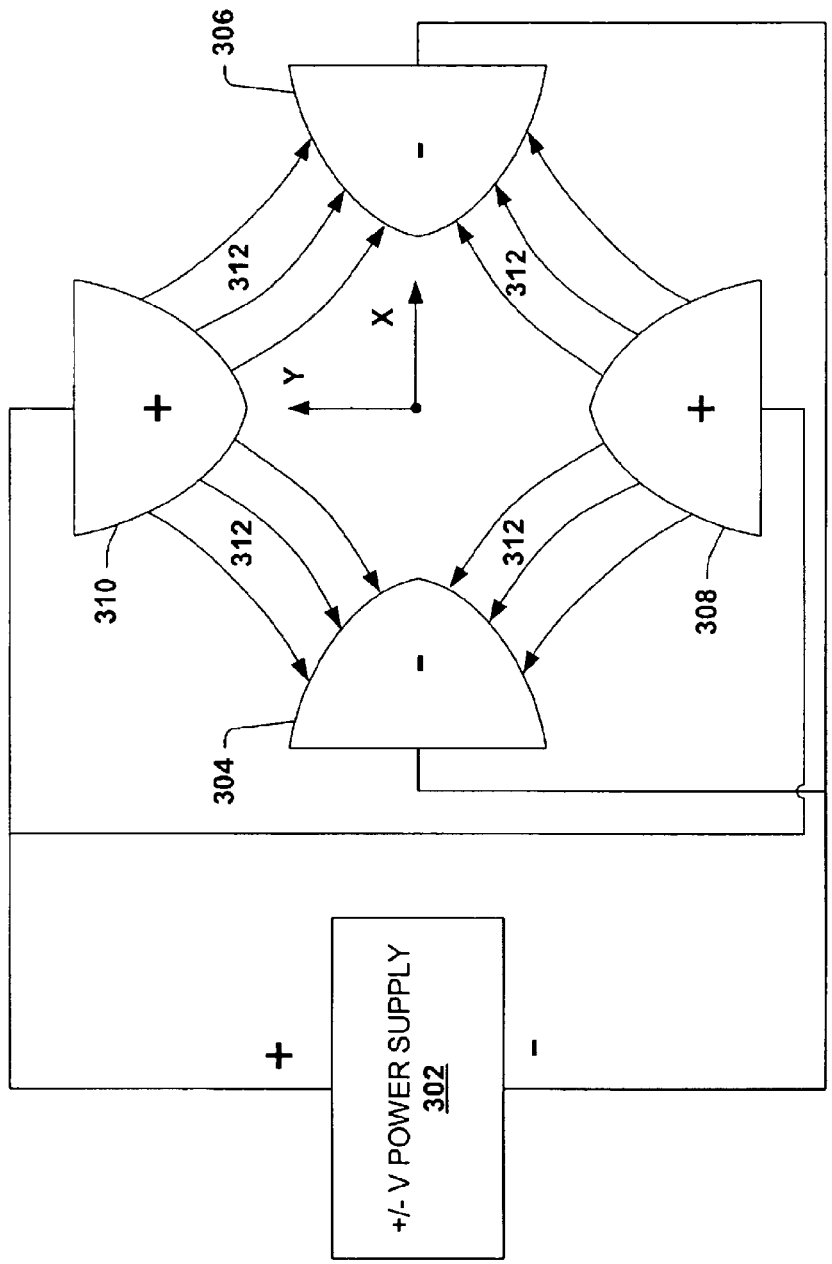
FIG. 3 is a diagram illustrating an exemplary conventional positive and negative bipolar electrostatic quadruple lens.

FIG. 3 is a diagram illustrating an exemplary, conventional positive and negative bipolar electrostatic quadrupole lens 300. The lens 300 includes a power supply 302 that provides a positive voltage and a negative voltage, substantially equal in magnitude. Additionally, the lens 300 includes a pair of negative electrodes 304, 306, located opposite each other, and a pair of positive electrodes 308, 310, located opposite each other, wherein the electrodes 304, 306, 308, 310 are equally spaced about a center point.

The negative electrode pair 304, 306 is connected to the power supply 302 and receives the negative voltage. As a result, the negative electrode pair 304, 306 is biased to a negative value. Additionally, the positive electrode pair 308, 310 is connected to the power supply 302 and receives the positive voltage, and thus is biased to a positive voltage. The electrodes (304, 306, 308, and 310) generate quadrupole electrostatic fields that selectively focus and defocus an ion beam that passes through the center point. As an example, positively charged ions in an ion beam are accelerated by the fields in the directions illustrated by the arrows 312, resulting in ion beam focusing in the Y direction and defocusing in the X direction. The amount of focusing/defocusing obtained is a function of the magnitude of the positive and negative voltages that bias the electrodes (304, 306, 308, and 310).

Figure 4:
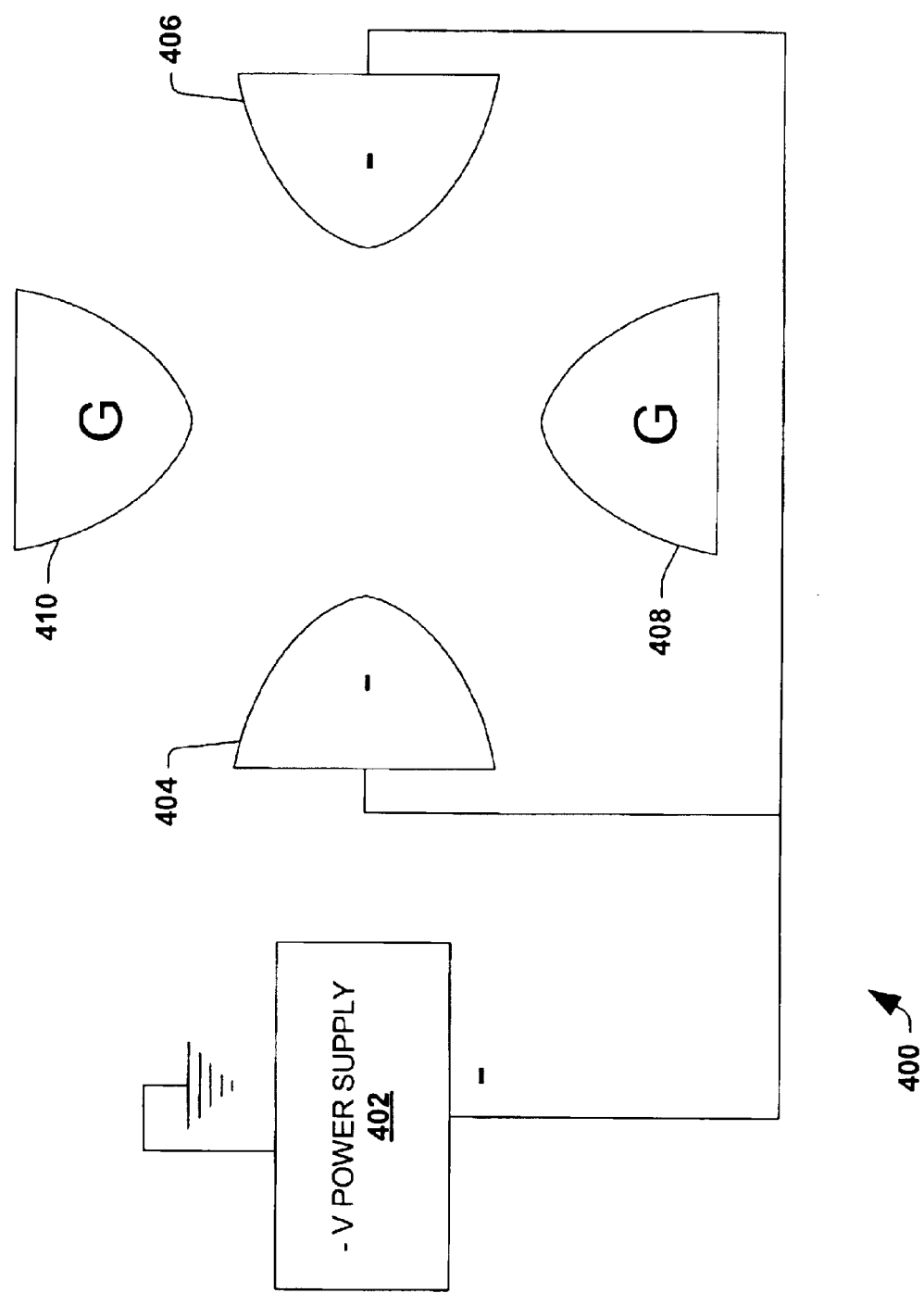
FIG. 4 is a diagram illustrating a negative potential unipolar electrostatic quadruple lens in accordance with an aspect of the present invention.

Turning now to FIG. 4, a diagram illustrating a negative unipolar electrostatic quadrupole lens 400 in accordance with an aspect of the present invention is depicted. The lens 400 includes a negative electrode pair 404, 406 and a ground electrode pair 408, 410.

A power supply 402 delivers a negative voltage to the negative electrode pair 408, 410. The ground electrode pair 408, 410 are connected to ground, typically through a low resistance path. Accordingly, the negative electrode pair is biased to a negative voltage value and the ground electrode pair 408, 410 is biased to ground. The electrodes generate electrostatic quadrupole fields in a manner similar to that illustrated in FIG. 3, wherein the beam is focused in one plane and concurrently defocused in a second, perpendicular plane.

While a complete understanding of the phenomena is not fully understood, the unipolar electrostatic quadrupole lens 400 mitigates loss of beam current due as compared to the bipolar positive and negative electrostatic quadrupole lens 300 of FIG. 3. It is believed that the positive potential electrodes reduce the beam current loss by exacerbating space charge effects on the positively charge ions present in the ion beam. In any event, with use of the unipolar electrostatic lens of FIG. 3, a two fold increase in resultant beam current has been observed in some instances at low energies.

Figure 5:
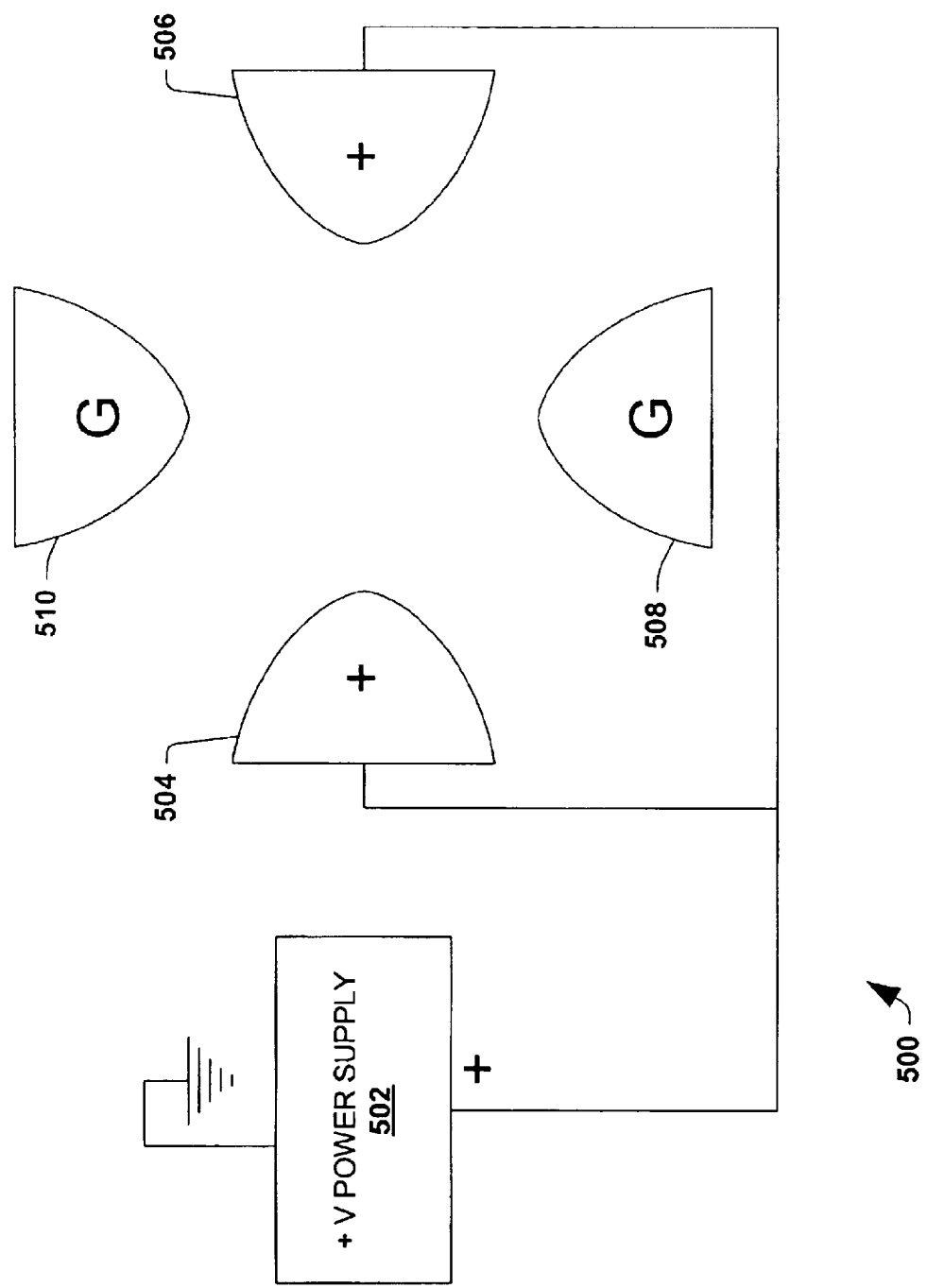
FIG. 5 is a diagram illustrating a positive potential unipolar electrostatic quadruple lens in accordance with an aspect of the present invention.

Turning now to FIG. 5, a diagram illustrating a positive unipolar electrostatic quadrupole lens 500 in accordance with an aspect of the present invention is depicted. The lens 500 includes a first positive electrode 504, a second positive electrode 506, a first ground electrode 508, and a second ground electrode 510.

A power supply 502 delivers a positive voltage to the first positive electrode 504 and the second positive electrode 506. The first ground electrode 508 and the second ground electrode 510 are connected to ground. Accordingly, the first positive electrode 504 and the second positive electrode 506 are biased to a positive voltage value and the first ground electrode 508 and the second ground electrode 510 are biased to a ground voltage value. The electrodes generate quadrupole fields from the electrodes, two positive and two neutral. As an example, the two neutral (ground) fields tend to defocus positively charged ions of an ion beam whereas the two positive fields tend to focus the positively charged ions.

The unipolar electrostatic quadrupole lens 500 mitigates loss of beam current due as compared to the bipolar positive and negative electrostatic quadrupole lens 300 of FIG. 3. However, the negative unipolar electrostatic quadrupole lens 400 of FIG. 4 tends to mitigate current loss better than the positive unipolar electrostatic quadrupole lens 500 of FIG. 5.

Figure 6:
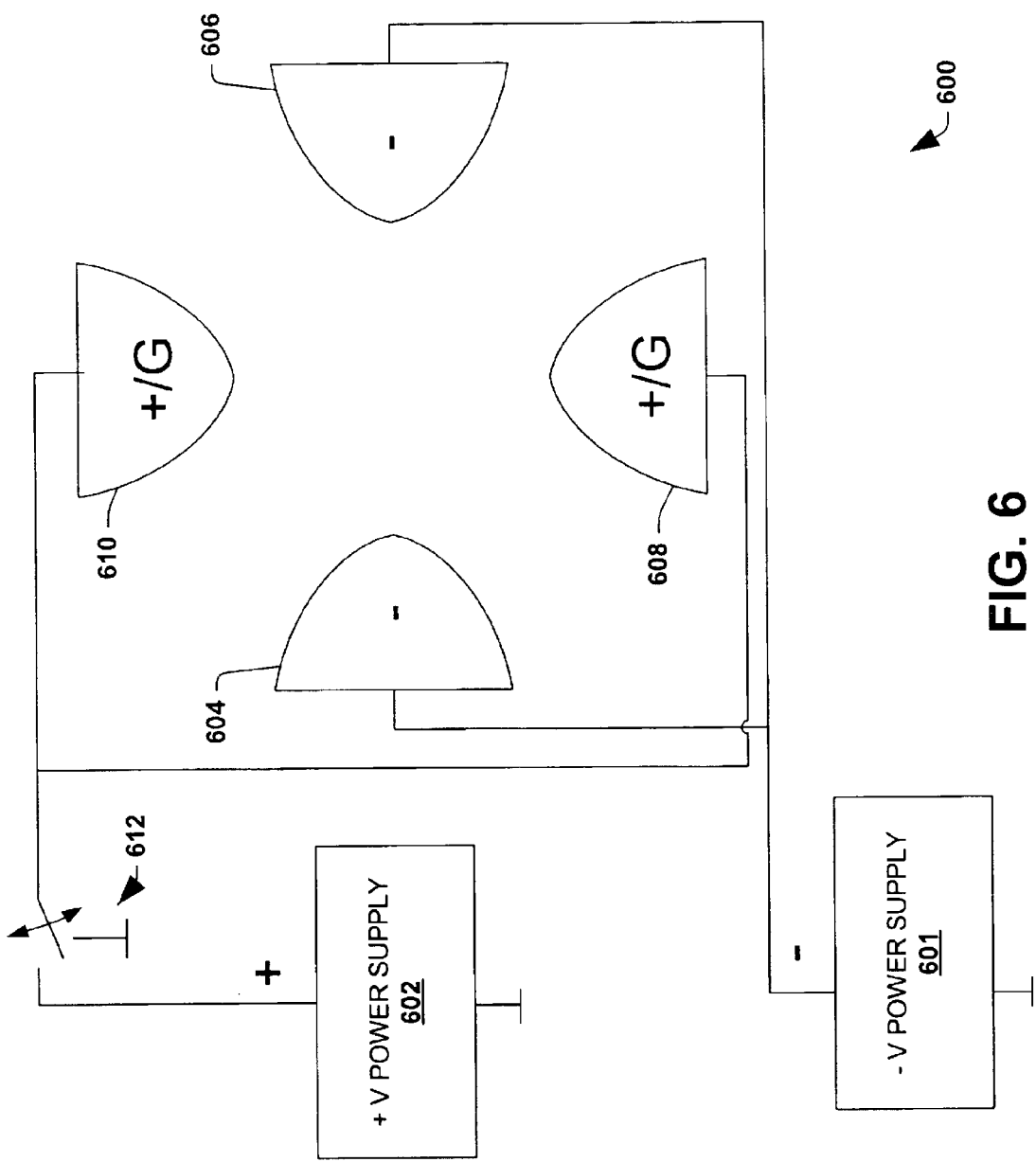
FIG. 6 is a diagram illustrating a switching circuit of an electrostatic quadruple lens in accordance with an aspect of the present invention.

FIG. 6 is a diagram illustrating a switching circuit of an electrostatic quadrupole lens 600 from unipolar to bipolar operation in accordance with an aspect of the present invention. A negative power supply 601 produces a negative voltage and a positive power supply 602 produces a positive voltage. The lens 600 comprises a first negative electrode 604, a second negative electrode 606, a first variable potential electrode 608 and a second variable potential electrode 610.

The first negative electrode 604 and the second negative electrode 606 receive the negative voltage from the negative power supply 601 and are thus, biased negative. The first variable potential electrode 608 and the second variable potential electrode 610 are either biased positive by the positive power supply 602 or biased to ground. A switch 612 is employed to control the biasing of the first variable potential electrode 608 and the second variable potential electrode 610, respectively. The switch 612 is a single pole double throw switch between the positive power supply 602 and ground. The switch 612 can be operated manually or automatically via a control system (not shown).

Figure 7:
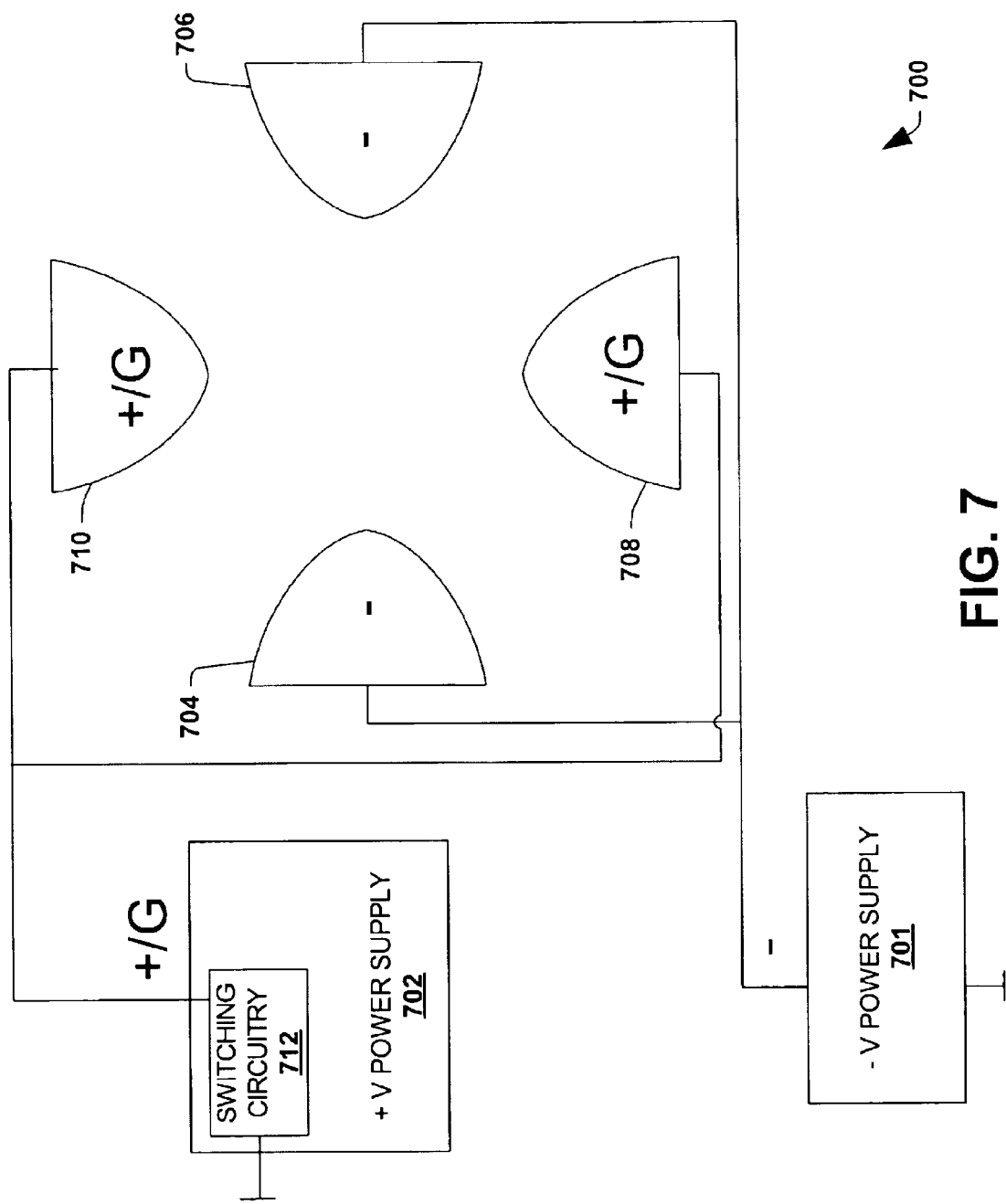
FIG. 7 is a diagram illustrating a switching circuit of an electrostatic quadruple lens in accordance with an aspect of the present invention.

FIG. 7 is a diagram illustrating another switching circuit of an electrostatic quadrupole lens 700 from unipolar to bipolar operation in accordance with an aspect of the present invention. A negative power supply 701 produces a negative voltage and a positive power supply 702 produces a positive voltage. The lens 700 comprises a negative electrode pair 704, 706 and a variable potential electrode pair 708, 710.

The negative electrode pair 704, 706 receives the negative voltage from the negative power supply 701 and is thus, biased negative. The variable potential electrode pair 708, 710 is either biased positive by the positive power supply 702 or biased to ground.

Switching circuitry 712 is included as part of the positive power supply 702. The switching circuitry 712 is operable to controllably provide a power supply output that is either a positive voltage value or is a low resistance path to ground. The switching circuitry 712 is employed to control the biasing of the variable potential electrode pair 708, 710.

FIGS. 6–7 depict two exemplary aspects of configuring an electrostatic quadrupole lens for dual and/or unipolar operation in accordance with the present invention. However, the present invention is not limited to these particular aspects and can be extended to include variations thereof, so long as the quadrupole lens can be selected to operate in dual or unipolar operation. Additionally, FIGS. 6–7 are described with respect to a single negative unipolar electrostatic quadrupole lens, but can be extended to a single positive unipolar electrostatic quadrupole lens and be in accordance with the present invention.

TABLE 1, below, illustrates some exemplary experimental results of unipolar electrostatic quadrupole lenses in accordance with the present invention and conventional bipolar electrostatic quadrupole lenses.

| 5 KeV energy, 420 uA injection current | | |
|---|---|---|
| | | Resulting current |
| Unipolar | negative | 150 uA |
| Unipolar | positive | ~100 uA |
| Conventional bipolar | positive and negative | ~30 uA |

It can be seen from TABLE 1, above, that the unipolar electrostatic quadrupole lens can yield substantially more beam current that the conventional bipolar electrostatic quadrupole lens. For example, for a low energy beam having 5 KeV energy and 420 uA injection current, the conventional bipolar electrostatic quadrupole lens yields only about 30 uA, whereas the positive unipolar electrostatic quadrupole lens yields about −100 uA and the negative unipolar electrostatic quadrupole lens yields about 150 uA. Thus, the positive unipolar electrostatic quadrupole lens provides about three times or more beam current than the conventional bipolar electrostatic quadrupole lens and the negative unipolar electrostatic quadrupole lens provides about five times the beam current than the conventional bipolar electrostatic quadrupole lens.

Figure 8:
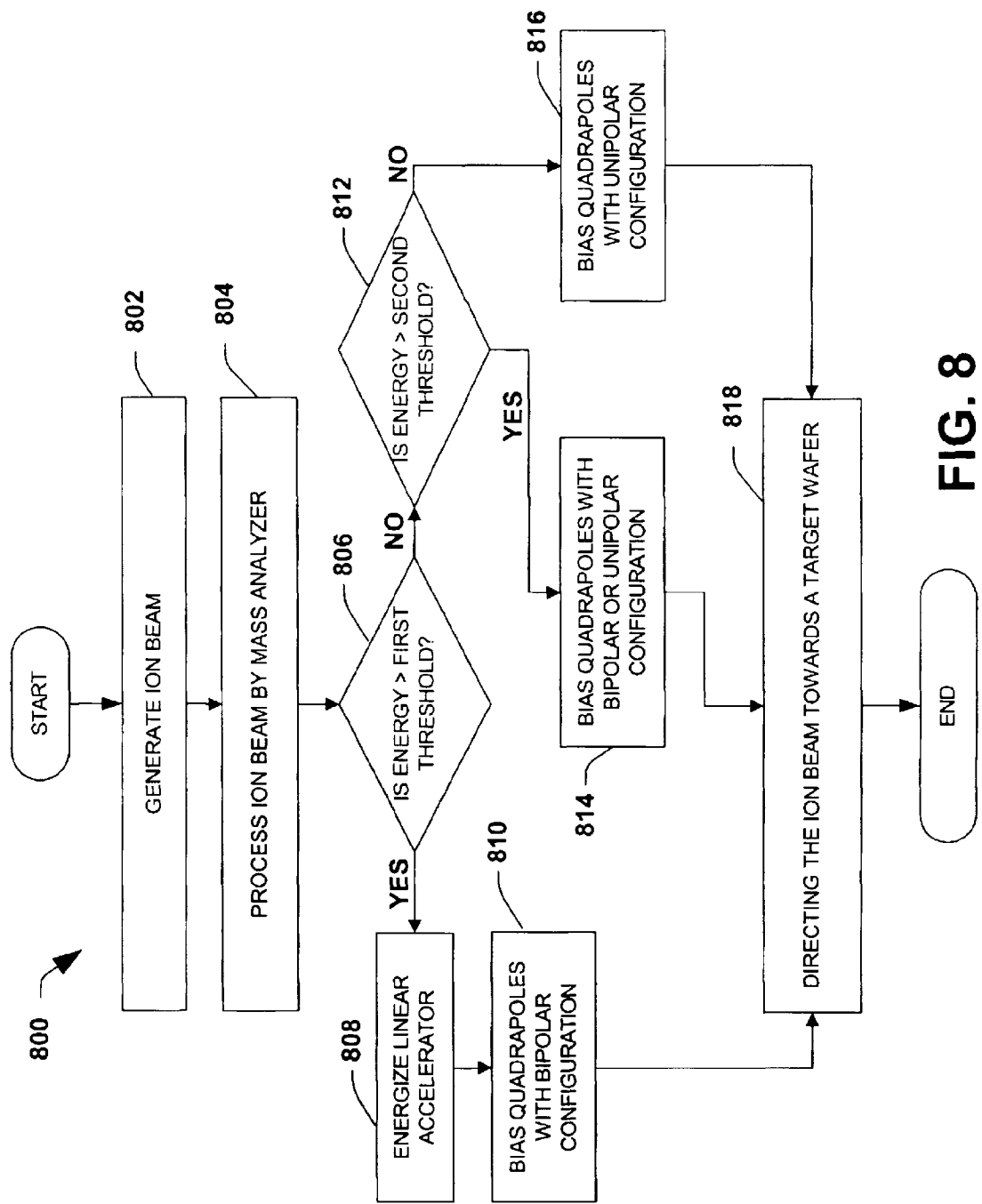
FIG. 8 is a flow diagram illustrating a method of generating a desired ion beam in accordance with an aspect of the present invention.

In view of the foregoing structural and functional features described supra, methodologies in accordance with various aspects of the present invention will be better appreciated with reference to FIGS. 1–7. While, for purposes of simplicity of explanation, the methodologies of FIGS. 8–9 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 8, a flow diagram of a method 800 of generating a desired ion beam in accordance with an aspect of the present invention is depicted. The method 800 is able to generate a desired ion beam with reduced beam current loss through a linear accelerator as compared with conventional ion beam generation methods (e.g., conventional ion implantation devices). The method 800 is particularly suited for relatively low energy ion beams (e.g., less than 80 KeV).

The method 800 begins at 802 wherein an ion beam comprised of positive or negative ions is generated by an ion source powered by a high voltage power supply. The ion beam is generated with an initial energy level and beam current, referred to as the injection current based, for example, on the biasing and configuration of the extraction beam associated with the ion source. The ion beam is then processed by a mass analyzer at block 804, wherein a magnetic field permits substantially only ions that have a desired charge-to-mass ratio to pass. Thus, undesired ions, atoms, and molecules are removed from the ion beam thereby leaving substantially only desired ions in the ion beam. At 806, a determination is made whether a desired energy of the beam is above a first threshold. For example, if a high energy beam is desired (e.g., several hundred to several hundred thousand keV), the desired energy would be greater than the first threshold (YES at 806). In that event, a linear accelerator system associated with the system is activated at 808, and the quadrupole lenses associated with the system are biased in a conventional bipolar configuration at 810.

If, however, the desired energy of the beam is less than a first threshold (NO at 806), a second determination is made at 812 whether the desired energy is greater than a second threshold. If the determination is YES at 812, then the desired energy is between second and first thresholds, and in that energy range, either a bipolar or unipolar quadrupole configuration may be employed at 814. One criteria for biasing the quadrupoles in the above condition is simply to maintain the bias arrangement within which the quadrupoles are currently configured. If, however, the desired energy of the beam is not greater than the second threshold (NO at 812), then a unipolar bias configuration of the quadrupoles is employed at 816. As discussed above, use of a unipolar configuration at low energies advantageously facilitates improved beam current in the ion implantation system.

Ions of the ion beam are selectively focused at block 808 by one or more unipolar electrostatic quadrupole lenses to yield an ion beam having a desired shape (e.g., symmetrical, oblong, and the like). In one example, the lenses are each comprised of two pairs of electrodes, all generally equally spaced about a center point through which the ion beam travels. A first opposing pair is biased to ground and a second opposing pair is biased to a positive or negative voltage. The electrodes generate quadrupole electric fields transverse to the path of the ion beam, thereby causing focusing and defocusing of the ion beam as previously discussed. By employing two such lenses and biasing them in an opposite fashion, the pair of lenses serve to maintain beam focus and mitigate space charge effects. The voltage value employed for biasing the second pair of electrodes is a function of desired focusing and defocusing. The method 800 continues at block 810 wherein the ion beam is directed towards a target wafer.

The ion beam is then directed at the wafer at 818, wherein such action may further include beam deceleration, deflection, etc., as may be desired. In the above example, the first threshold is about 80 keV and the second threshold is about 50 keV, however, other threshold values may be employed and are contemplated as falling within the scope of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An electrostatic quadrupole lens system comprising:
    a switching circuit controllably connected to ground and a first voltage potential;
    a first pair of electrodes located opposite each other, connected to the switching circuit;
    a second pair of electrodes located opposite each other, wherein the first pair of electrodes and the second pair of electrodes are equally spaced about a center point, the second pair of electrodes biased to a second voltage potential.

2. The system of claim 1, wherein the first voltage potential is positive and the second voltage potential is negative.

3. The system of claim 1, wherein the first voltage potential is negative and the second voltage potential is positive.

4. The system of claim 1, wherein the switching circuit is part of a power supply that provides the first voltage potential to the first pair of electrodes.

5. A linear acceleration system comprising:
- one or more accelerating stages along an axis of the system; and
- a first electrostatic quadrupole lens in series with the one or more accelerating stages that focuses an ion beam in a direction transverse to the axis, wherein the first electrostatic quadrupole lens comprises:
  - a switching circuit controllably connected to ground and a first voltage potential;
  - a first pair of electrodes located opposite each other, connected to the switching circuit; and
  - a second pair of electrodes located opposite each other, wherein the first pair of electrodes and the second pair of electrodes are equally spaced about a center point, the second pair of electrodes biased to a second voltage potential.

6. The system of claim 5, further comprising a second electrostatic quadrupole lens in series with the first electrostatic quadrupole lens, wherein the first lens focuses in a first direction and the second lens focuses in a second direction that is generally perpendicular to the first direction.

7. The system of claim 6, wherein the second electrostatic lens is unipolar.

8. The system of claim 6, wherein the second electrostatic lens is bipolar.

9. The system of claim 5, further comprising a low energy ion beam that travels along the axis and is shaped by the first electrostatic quadrupole lens without a substantial loss of beam current.

10. The system of claim 9, wherein the low energy ion beam is at an energy level of less than about 90 KeV.

11. The system of claim 9, wherein the low energy ion beam is at an energy level of less than about 20 KeV.

12. A method of operating an ion implantation system, comprising:
- extracting an ion beam from an ion source;
- determining whether a desired ion beam energy is greater than a first threshold; and
- configuring a quadrupole lens along a beam path of the ion beam in one of a bipolar configuration or a unipolar configuration based on the determination.

13. The method of claim 12, wherein the quadrupole lens is configured in the unipolar configuration if the desired ion beam energy is less than the first threshold.

14. The method of claim 12, further comprising determining whether the desired beam energy is greater than a second threshold, wherein the second threshold is less than the first threshold.

15. The method of claim 14, wherein the quadrupole lens is configured in the unipolar configuration if the desired ion beam energy is less than the second threshold.

16. The method of claim 15, wherein the quadrupole lens is configured in the unipolar configuration or the bipolar configuration is the desired ion beam energy is greater than the second threshold and less than the first threshold.

* * * * *